US012696444B2

(12) United States Patent
Han

(10) Patent No.: US 12,696,444 B2
(45) Date of Patent: Jul. 28, 2026

(54) MEMORY INCLUDING ZIGZAG BIT LINES AND METHOD FOR MANUFACTURING SAME

(71) Applicant: CHANGXIN MEMORY TECHNOLOGIES, INC., Hefei City (CN)

(72) Inventor: Qinghua Han, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 509 days.

(21) Appl. No.: 18/321,762

(22) Filed: May 22, 2023

(65) Prior Publication Data

US 2023/0301071 A1     Sep. 21, 2023

Related U.S. Application Data

(63) Continuation of application No. PCT/CN2022/079999, filed on Mar. 9, 2022.

(30) Foreign Application Priority Data

Jan. 11, 2022     (CN) .......................... 202210028966.0

(51) Int. Cl.
*H10B 12/00*     (2023.01)
(52) U.S. Cl.
CPC ........... *H10B 12/485* (2023.02); *H10B 12/03* (2023.02); *H10B 12/482* (2023.02); *H10B 12/488* (2023.02)
(58) Field of Classification Search
CPC .... H10B 12/485; H10B 12/03; H10B 12/482; H10B 12/488; H10B 12/033; H10B 12/05
(Continued)

(56) References Cited

U.S. PATENT DOCUMENTS 6,512,276 B1     1/2003   Tanaka
10,714,490 B1    7/2020   Xiao
(Continued)

FOREIGN PATENT DOCUMENTS

CN     107482007 A     12/2017
CN     107946302 A     4/2018
(Continued)

OTHER PUBLICATIONS

Extended European Search Report in application No. 22908829, mailed on Jun. 28, 2024.
(Continued)

*Primary Examiner* — Duy T Nguyen
(74) *Attorney, Agent, or Firm* — Syncoda LLC; Feng Ma

(57)     ABSTRACT

A method for manufacturing a memory includes: providing a substrate provided with bit lines, each bit line including a plurality of straight line segments connected end to end in sequence, and adjacent straight line segments have an included angle therebetween; forming active pillars and insulating layers on the substrate, each straight line segment of each bit line being electrically connected with at least two active pillars, each insulating layer extending in a first direction and covering the outer peripheral surface of the active pillar; filling a first support layer between adjacent insulating layers; removing part away from the substrate, of each insulating layer to form a filling space; and forming a dielectric layer and a conductive layer between parts exposed in the filling space and close to the substrate, of the active pillars.

13 Claims, 26 Drawing Sheets

(58) Field of Classification Search
USPC .......................................................... 439/197
See application file for complete search history.

(56) References Cited

U.S. PATENT DOCUMENTS

| | | | |
|---|---|---|---|
| 2006/0046407 A1* | 3/2006 | Juengling ............ | H10D 64/027 |
| | | | 257/E21.429 |
| 2006/0097304 A1* | 5/2006 | Yoon .................... | H10D 30/025 |
| | | | 257/E21.655 |
| 2012/0056255 A1* | 3/2012 | Sukekawa ............ | H10B 12/482 |
| | | | 257/329 |
| 2016/0042960 A1* | 2/2016 | Kim .................. | H01L 21/28531 |
| | | | 438/269 |

FOREIGN PATENT DOCUMENTS

| | | | |
|---|---|---|---|
| CN | 208284477 U | * | 12/2018 |
| CN | 109698193 A | | 4/2019 |
| CN | 110235249 A | | 9/2019 |
| CN | 112838085 A | | 5/2021 |
| CN | 112838086 A | | 5/2021 |
| CN | 112838087 A | | 5/2021 |
| JP | 2001035941 A | | 2/2001 |

OTHER PUBLICATIONS

International Search Report in the international application No. PCT/CN2022/079999, mailed on Sep. 27, 2022.

* cited by examiner

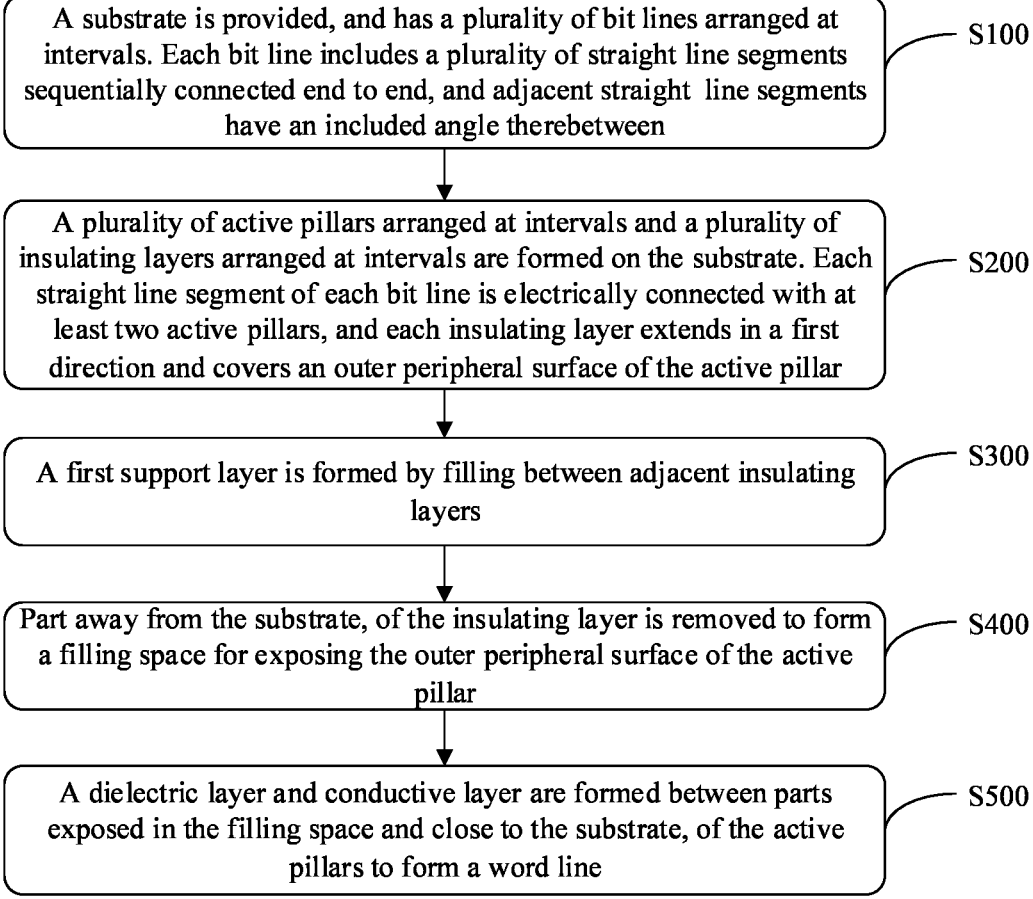

A substrate is provided, and has a plurality of bit lines arranged at intervals. Each bit line includes a plurality of straight line segments sequentially connected end to end, and adjacent straight line segments have an included angle therebetween — S100

A plurality of active pillars arranged at intervals and a plurality of insulating layers arranged at intervals are formed on the substrate. Each straight line segment of each bit line is electrically connected with at least two active pillars, and each insulating layer extends in a first direction and covers an outer peripheral surface of the active pillar — S200

A first support layer is formed by filling between adjacent insulating layers — S300

Part away from the substrate, of the insulating layer is removed to form a filling space for exposing the outer peripheral surface of the active pillar — S400

A dielectric layer and conductive layer are formed between parts exposed in the filling space and close to the substrate, of the active pillars to form a word line — S500

MEMORY INCLUDING ZIGZAG BIT LINES AND METHOD FOR MANUFACTURING SAME

CROSS-REFERENCE TO RELATED APPLICATIONS

This is a continuation of International Application No. PCT/CN2022/079999 filed on Mar. 9, 2022, which claims priority to Chinese Patent Application No. 202210028966.0 filed on Jan. 11, 2022. The disclosures of the above-referenced applications are hereby incorporated by reference in their entirety.

BACKGROUND

With the continuous development of semiconductor technology and storage technology, electronic devices are developing towards miniaturization and integration. A dynamic random access memory (DRAM) is widely used in various electronic devices because of its high storage density and fast reading and writing speed. The dynamic random access memory is generally composed of multiple storage cells, each of which usually includes a transistor and a capacitor. The capacitor stores data information, and the transistor controls reading and writing of the data information in the capacitor. However, in the existing structure, the width of a word line is small and the resistance of the word line is large, which makes the manufacture of the memory difficult and the performance poor.

SUMMARY

In view of the above problems, embodiments of the disclosure provide a memory and a method for manufacturing the same, which can reduce the manufacturing difficulty of the memory and improve the performance of the memory.

The disclosure relates to the technical field of semiconductors, in particular to a memory and a method for manufacturing the same.

A first aspect of the embodiments of the disclosure provides a method for manufacturing a memory. The method includes the following operations.

A substrate is provided. A plurality of bit lines arranged at intervals are formed in the substrate, in which each bit line includes a plurality of straight line segments connected end to end in sequence, and adjacent straight line segments have an included angle therebetween.

A plurality of active pillars arranged at intervals and a plurality of insulating layers arranged at intervals are formed on the substrate. Each straight line segment of each bit line is electrically connected with at least two active pillars, and each insulating layer extends in a first direction and covers an outer peripheral surface of the active pillar.

A first support layer fills between adjacent insulating layers.

Part away from the substrate, of the insulating layer is removed to form a filling space. The filling space exposes part of the outer peripheral surface of the active pillar.

A dielectric layer and a conductive layer are formed between parts exposed in the filling space and close to the substrate, of the active pillars to form a word line.

A second aspect of the embodiments of the disclosure provides a memory. The memory includes: a substrate provided with a plurality of bit lines arranged at intervals, each bit line including a plurality of straight line segments connected end to end in sequence, and adjacent straight line segments having an included angle therebetween; a plurality of active pillars formed and arranged at intervals on the substrate, each straight line segment of each bit line being electrically connected with at least two active pillars; a plurality of insulating layers formed and arranged at intervals on the substrate, each insulating layer extending in a first direction and covering a lower region of an outer peripheral surface of the active pillar; a dielectric layer formed on a middle region of the outer peripheral surface of the active pillar; a plurality of conductive layers formed and arranged at intervals on the insulating layer, each conductive layer extending in the first direction and covering an outer peripheral surface of the dielectric layer to form a word line; and a support layer filling between the insulating layers, between the conductive layers, and between the active pillars.

BRIEF DESCRIPTION OF THE DRAWINGS

FIG. 1 is a flowchart of a method for manufacturing a memory in an embodiment of the disclosure.

3

Figure 24:
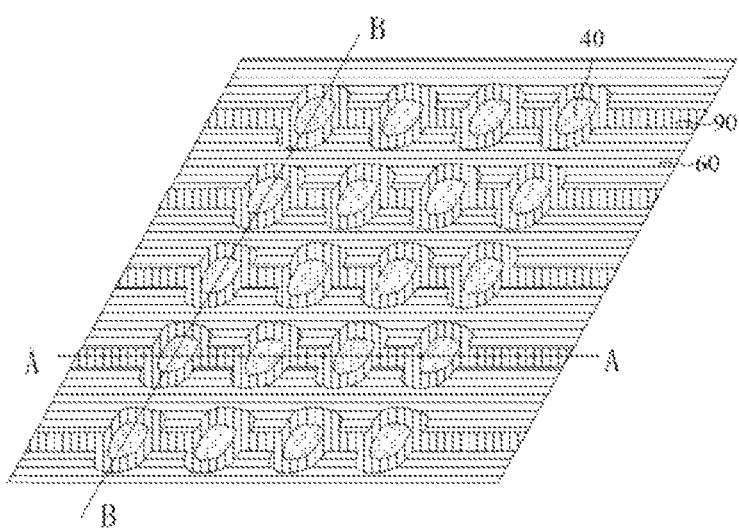
FIG. 24 is a top view after a second support layer is formed in an embodiment of the disclosure.
Figure 26:
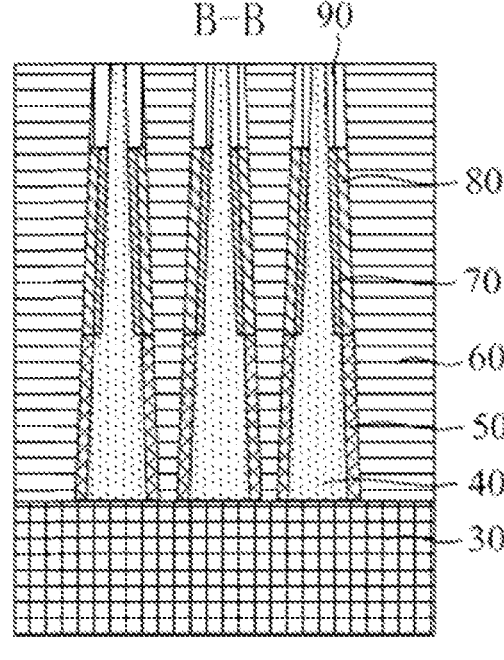

FIG. 26 is a schematic structural diagram at B-B in FIG. 24.

DETAILED DESCRIPTION

With the miniaturization of the size of integrated circuits, it is more difficult to manufacture a memory. With the decreases of the pitch between adjacent word lines, defects are easily to appear in the word lines during manufacturing, which affects the performance of the memory. In view of the above, the embodiments of the disclosure provide a method for manufacturing a memory, in which a substrate is provided, and active pillars are formed on the substrate. A plurality of bit lines are formed in the substrate, and each bit line includes a plurality of straight line segments connected end to end in sequence. Adjacent straight line segments have an included angle therebetween. Each straight line segment of each bit line is electrically connected with at least two active pillars, so that the plurality of active pillars are staggered on the substrate, which can improve the density of the active pillars and increase the width of the gate, thereby improving the performance of the memory. Meanwhile, the bending number of each bit line is reduced, which is convenient for the manufacture of the memory.

In order to make the above-mentioned objects, features and advantages of the embodiments of the disclosure more apparent and understandable, the technical solutions in the embodiments of the disclosure will be clearly and completely described with reference to the drawings in the embodiments of the disclosure. Apparently, the described embodiments are only a part of the embodiments of the disclosure, but not all of them. Based on the embodiments in the disclosure, any other embodiments obtained by those of ordinary skill in the art without making creative efforts are within the scope of protection of the disclosure.

Referring to FIG. 1, it is a flowchart of a method for manufacturing a memory in an embodiment of the disclosure. The method includes the following operations.

At S100, a substrate is provided, in which a plurality of bit lines arranged at intervals are formed in the substrate. Each bit line includes a plurality of straight line segments connected end to end in sequence, and adjacent line segments have an included angle therebetween.

The substrate is used for providing a support, and may be a semiconductor substrate. The material of the semiconductor substrate may be one or more of silicon, germanium, silicon germanium, silicon carbide, Silicon on Insulator (SOI), Germanium on Insulator (GOI) or the like.

Figure 2:
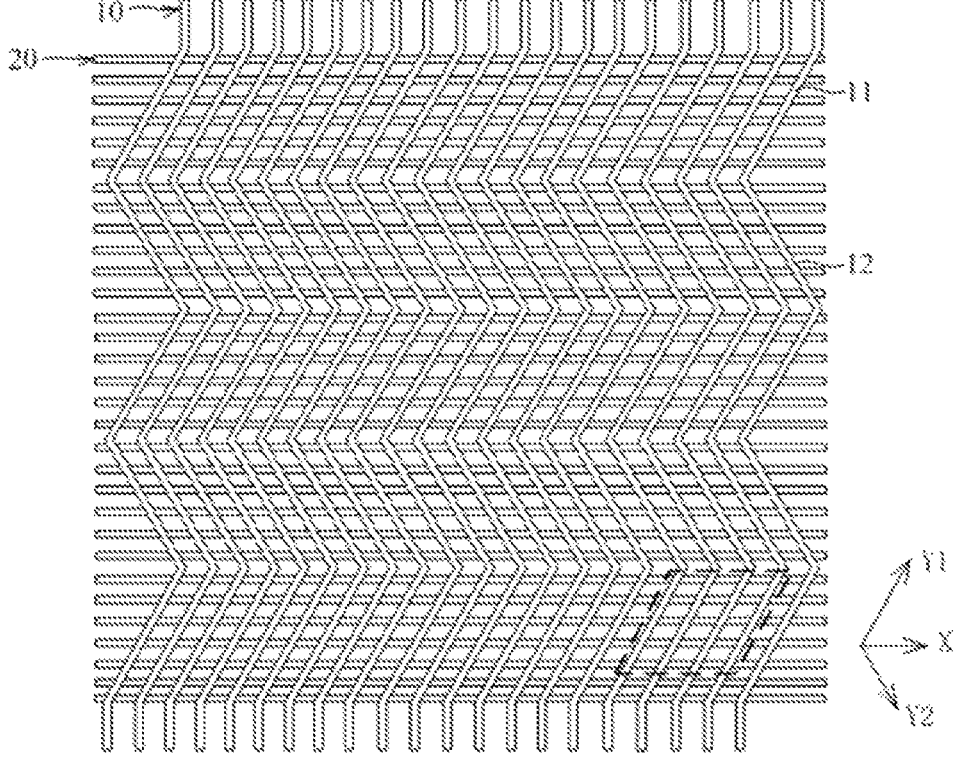
FIG. 2 is a schematic structural diagram of bit lines and word lines in an embodiment of the disclosure.

The plurality of bit lines 10 arranged at intervals are formed in a substrate (referring to FIG. 2). Each bit line 10 includes a plurality of straight line segments connected end to end in sequence and adjacent line segments have an included angle therebetween, so that each bit line 10 is in a zigzag type.

Specifically, the plurality of straight line segments included by each bit line 10 include a plurality of first straight line segments 11 extending in a second direction (direction Y1 shown in FIG. 2) and a plurality of second straight line segments 12 extending in a third direction (direction Y2 shown in FIG. 2). Each second line segment 12 is connected with two adjacent first straight line segments 11, so that each bit line 10 is in form of a wavy polyline to make full use of the space of the substrate. Exemplarily, the included angle formed by the second direction and the third direction may be 30° to 150°, for example 120°.

At S200, a plurality of active pillars arranged at intervals and a plurality of insulating layers arranged at intervals are formed on the substrate. Each straight line segment of each bit line is electrically connected with at least two active pillars. The insulating layers extend along a first direction and cover the outer peripheral surfaces of the active pillars.

Figure 3:
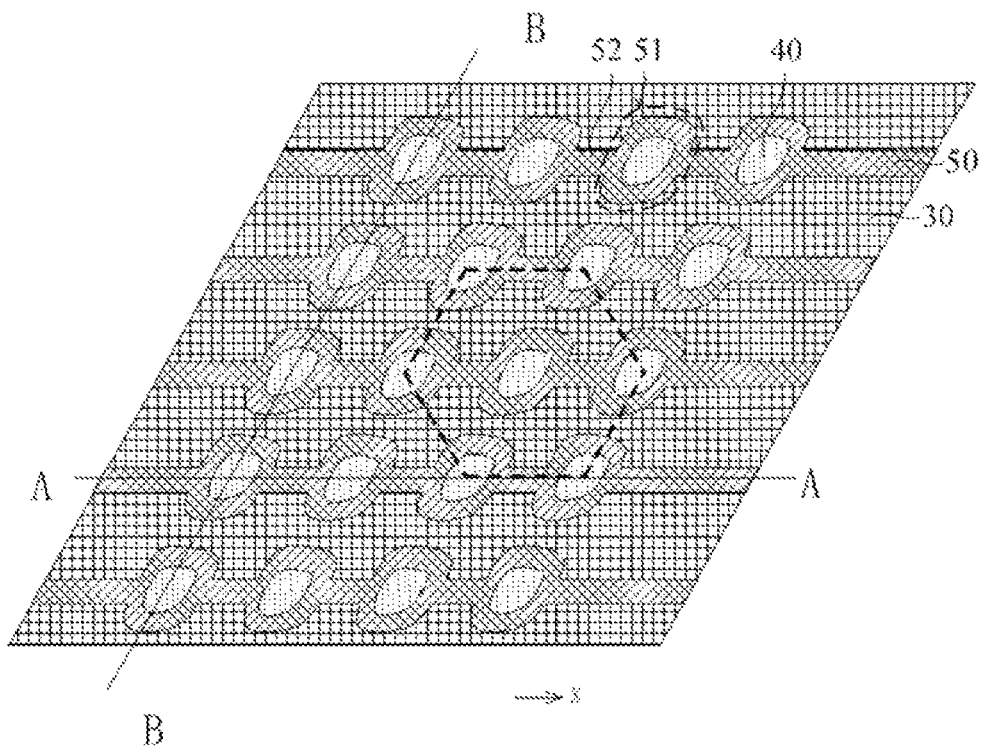
FIG. 3 is a top view after active pillars and insulating layers are formed in an embodiment of the disclosure.
Figure 4:
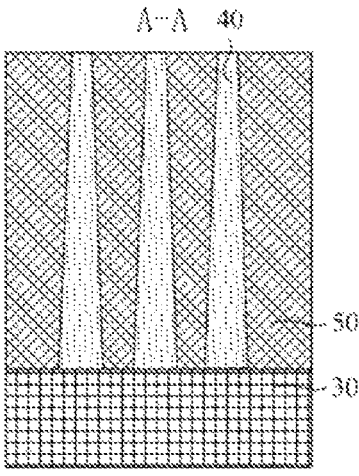
FIG. 4 is a schematic structural diagram at A-A in FIG. 3.
Figure 5:
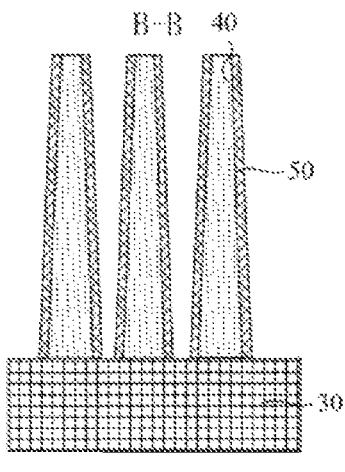
FIG. 5 is a schematic structural diagram at B-B in FIG. 3.

Referring to FIG. 3 to FIG. 5, the plurality of active pillars 40 and the plurality of insulating layers 50 are formed on the substrate 30. In order to distinguish elements in the drawing, the active pillars 40 are filled with patterns in a top view in the embodiments of the disclosure. The top view is a partial view of the memory, for example, the view of a partial area enclosed by dashed lines in FIG. 2. The plurality of active pillars 40 are arranged at intervals, and each straight line segment of each bit line 10 (referring to FIG. 2) is electrically connected with at least two active pillars 40. For example, the active pillars 40 are in contact with the corresponding bit line 10 to achieve the electrical connection between the active pillars 40 and the bit line 10. By electrically connecting multiple active pillars 40 with each straight line segment, it is avoided that each bit line 10 needs to be bent once every time it passes through one active pillar 40, thereby reducing the bending number of each bit line 10 and reducing the manufacturing difficulty of the bit line 10.

In some possible embodiments, the bit line 10 covers the orthographic projections of multiple active pillars 40 on the substrate 30. By this arrangement, the entire bottom surface of the active pillar 40 is in contact with the bit line 10, and thus contact area between the active pillar 40 and the bit line 10 is large, thereby reducing the contact resistance between the active pillar 40 and the bit line 10.

The active pillars 40 are used to form a source region, a drain region, and a channel region located between the source region and the drain region. The source region, drain region and channel region are arranged in a direction perpendicular to the substrate 30, and one of the source region and drain region is in contact with the substrate 30. The material of an active area may be a semiconductor material. Exemplarily, the material of the active pillar 40 may be the same as or different from the material of the substrate 30. The substrate 30 and the active pillars 40 located on the substrate 30 are formed by etching the semiconductor material, in which the bit lines 10 are embedded bit lines.

In a possible embodiment, taking a plane parallel to the substrate 30 as a cross section, multiple active pillars 40 are arranged in a hexagonal close-packed structure. The hexagonal close-packed structure can be seen in FIG. 3. Each seven active pillars 40 is regarded as a group, in which the centers of six active pillars 40 enclose into a virtual hexagon, i.e. the centers of the six active pillars 40 are respectively located at the six vertices of the virtual hexagon, and the center of the seventh active pillar 40 is located at the center of the virtual hexagon. Taking the plane parallel to the substrate as a cross section, the cross section of the active pillar 40 may not be in a shape of circular, which does not affect the arrangement of the plurality of active pillars 40.

By this arrangement, the density of the active pillars 40 can be increased. When capacitors on the active pillars 40 are also arranged in the hexagonal close-packed structure, on the one hand, the density of the capacitors can be increased, thereby increasing the density of memories; on the other hand, the capacitor can be directly on the active pillar 40, without arranging a capacitor contact pad to transition the formation between the capacitor and the active pillar 40, thereby reducing the complexity of manufacturing the memory. For example, when the active pillars 40 are arranged in a square structure, it is necessary to manufacture capacitor contact pads on the active pillars 40, so as to arrange the capacitors in the hexagonal close-packed structure.

Still referring to FIG. 3 to FIG. 5, the plurality of insulating layers 50 are arranged at intervals, extend in the first direction (direction X shown in FIG. 3) and cover on the outer peripheral surfaces of the active pillars 40. As shown in FIG. 3, each insulating layer 50 corresponds to at least one active area located in the first direction and covers on the outer peripheral surface of at least one active area. The material of the insulating layer 50 may be silicon oxide, silicon nitride, silicon oxynitride or the like.

Specifically, as shown in FIG. 3, each insulating layer 50 includes a first surrounding portion 51 and a first connecting portion 52. The first surrounding portion 51 is shown as an area surrounded by dashed lines in FIG. 3, covers on the outer peripheral surface of the active pillar 40. The first connecting portion 52 is connected with two adjacent first surrounding portions 51 and extends in the first direction. That is, the first surrounding portion 51 corresponds to the active pillar 40, and surrounds the entire circumference of the active pillar 40, and the first connecting portion 52 is connected with two adjacent first surrounding portions 51 in the first direction.

At S300, a first support layer is formed by filling between adjacent insulating layers.

Figure 6:
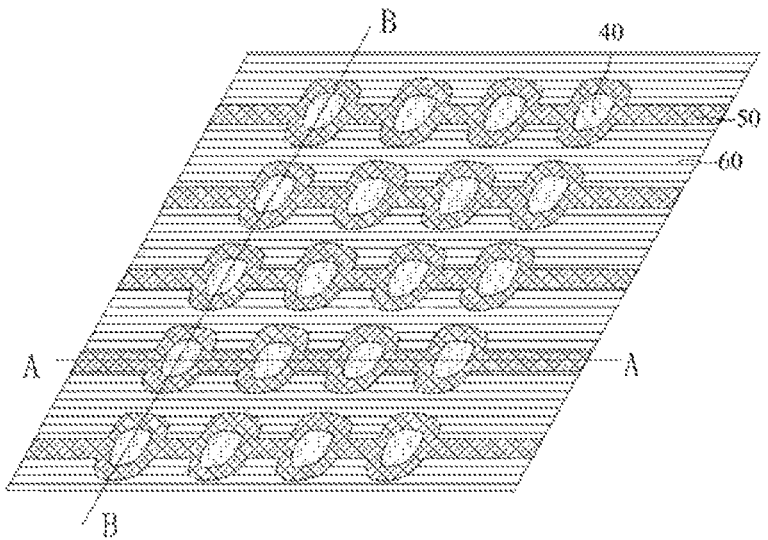
FIG. 6 is a top view after a first support layer is formed in an embodiment of the disclosure.
Figure 7:
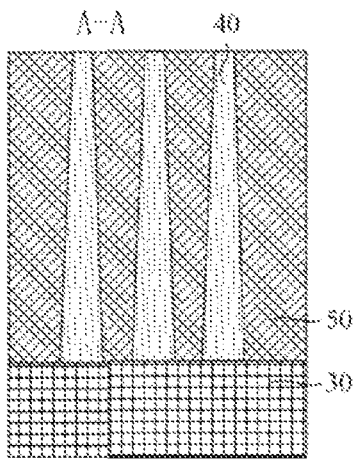
FIG. 7 is a schematic structural diagram at A-A in FIG. 6.
Figure 8:
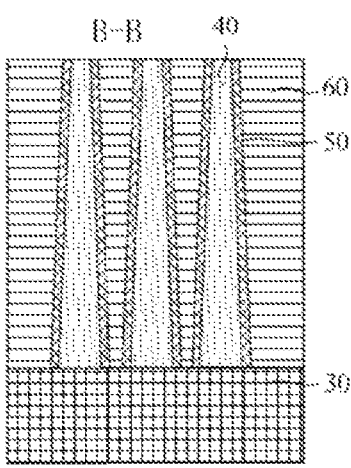
FIG. 8 is a schematic structural diagram at B-B in FIG. 6.

Referring to FIG. 6 to FIG. 8, the first support layer 60 is formed between adjacent insulating layers 50 by a deposition process. The first support layer 60 fills up the space between adjacent insulating layers 50. For example, the space between adjacent insulating layers 50 is filled by a process of chemical vapor deposition (CVD), physical vapor deposition (PVD), atomic layer deposition (ALD) or the like, to form the first support layer 60.

As shown in FIG. 7 and FIG. 8, the surface facing away from the substrate 30, of the first support layer 60 may be flush with the surface facing away from the substrate 30, of the insulating layer 50. That is, the top surface of the first support layer 60 is flush with the top surface of the insulating layer 50. The material of the first support layer 60 may be silicon oxide, silicon nitride or silicon oxynitride, and is different from the material of the insulating layer 50, so as to reduce the damage to the first support layer 60 when the insulating layer is subsequently removed. Exemplarily, the material of the insulating layer 50 is silicon oxide (e.g., SiO$_2$), and the material of the first support layer 60 is silicon nitride (e.g., Si$_3$N$_4$).

At S400, part away from the substrate, of the insulating layer is removed to form a filling space which exposes part of the outer peripheral surface of the active pillar.

Figure 9:
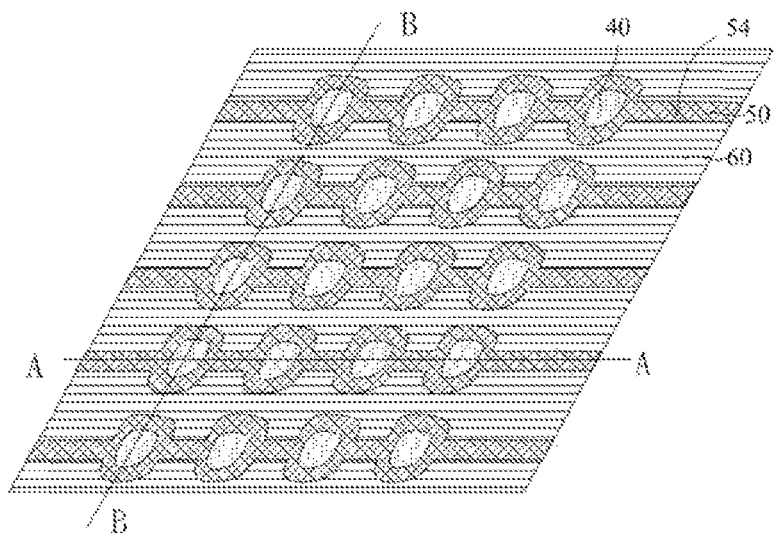
FIG. 9 is a top view after part of a first support layer is removed in an embodiment of the disclosure.
Figure 10:
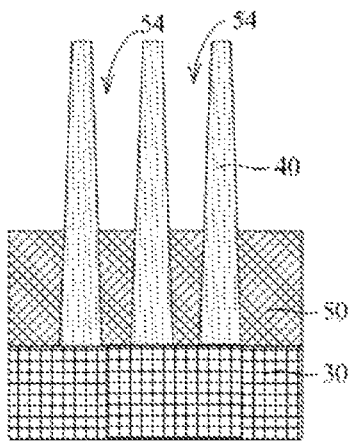
FIG. 10 is a schematic structural diagram at A-A in FIG. 9.
Figure 11:
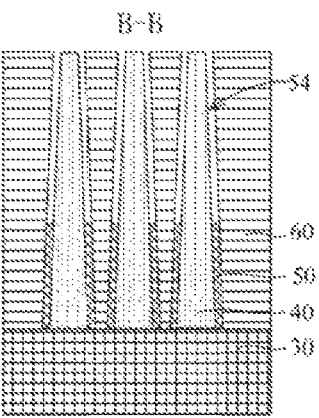
FIG. 11 is a schematic structural diagram at B-B in FIG. 9.

Referring to FIG. 9 to FIG. 11, part away from the substrate 30, of the insulating layer 50 is removed. For example, this part of the insulating layer 50 is removed by etching. As shown in FIG. 10 and FIG. 11, the middle part and upper part of the insulating layer 50 are removed to retain the lower part of the insulating layer 50. A filling space 54 is formed after part of the insulating layer 50 is removed. The filling space 54 exposes the outer peripheral surface of the active pillar 40. Specifically, the filling space 54 exposes the outer peripheral surface of the channel region, so as to form a dielectric layer 70 and a conductive layer 80 on the outer peripheral surface of the channel region.

At S500, a dielectric layer and a conductive layer are formed between parts exposed in the filling space and close to the substrate, of the active pillars to form a word line.

Figure 12:
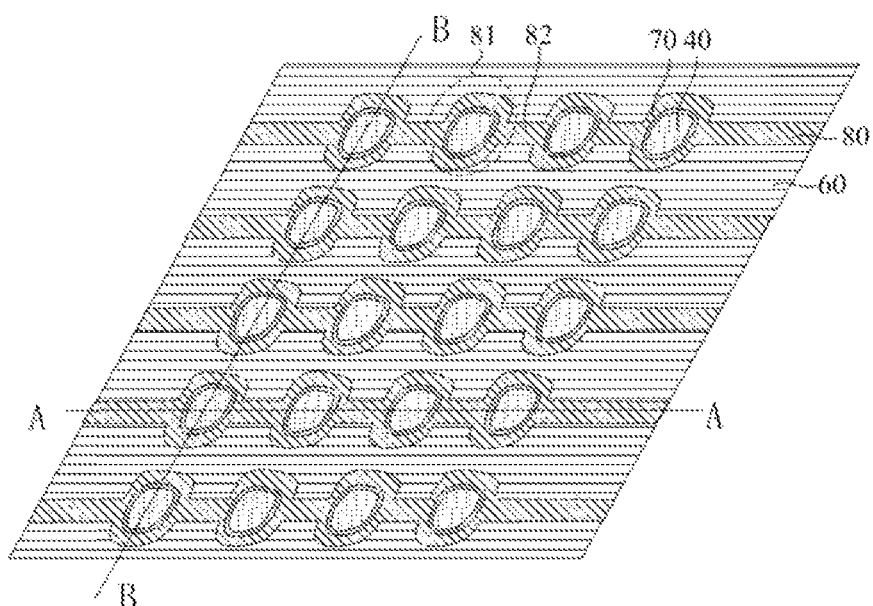
FIG. 12 is a top view after a dielectric layer and a conductive layer are formed in an embodiment of the disclosure.
Figure 13:
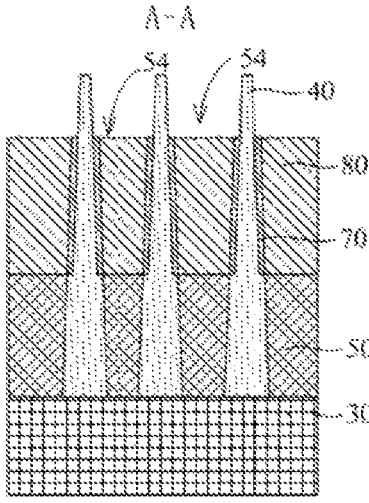
FIG. 13 is a schematic structural diagram at A-A in FIG. 12.
Figure 14:
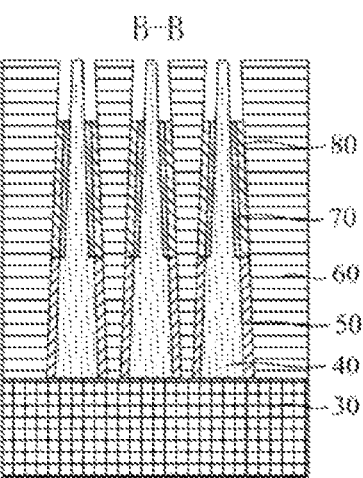
FIG. 14 is a schematic structural diagram at B-B in FIG. 12.

Referring to FIG. 12 to FIG. 14, the dielectric layer 70 is formed on part, exposed in the filling space 54 and close to the substrate 30, of the outer peripheral surface of the active pillar 40, and a conductive layer 80 is formed on the outer peripheral surface of the dielectric layer 70. The conductive layer 80 is formed by filling between the dielectric layer 70 and the first support layer 60. The conductive layer 80 and the dielectric layer 70 form a word line. The dielectric layer 70 and the conductive layer 80 surrounding the outer peripheral surface of the dielectric layer 70 form a gate. That is, the gate is part of the word line 20. The word line 20 extends in the first direction. Specifically, the dielectric layer 70 may be an oxide layer, and forms a gate oxide layer. The material of the conductive layer 80 may be a metal, and the conductive layer 80 surrounding the outer peripheral surface of the dielectric layer 70 forms a gate conductive layer.

In some possible embodiments, the included angle between the second direction and the first direction shown in FIG. 2 is 60°, the included angle between the third direction and the first direction is 60°. A first pitch between adjacent word lines 20 is equal to a second pitch between adjacent bit lines 10. By this arrangement, it is convenient to form the plurality of active pillars 40 arranged in the hexagonal close-packed structure (referring to FIG. 3), reducing the difficulty of manufacturing the active pillars 40 arranged in the hexagonal close-packed structure.

In some possible embodiments, forming the dielectric layer and the conductive layer between the active pillars exposed in the filling space and close to the substrate to form the word line (S500) may include the following operations.

At S501, part exposed in the filling space and close to the substrate, of the outer peripheral surface of the active pillar is at least removed to thin the active pillar and enlarge the filling space.

As shown in FIG. 13 and FIG. 14, part exposed in the filling space 54 and close to the substrate 30, of the outer peripheral surface of the active pillar 40 is at least removed to thin the active pillar 40 and enlarge the filling space 54, thereby increasing the space for forming a gate and improving the forming quality of the gate.

Exemplarily, all the part exposed in the filling space 54, of the active pillar 40 is etched by a process such as wet etching, so that all the outer peripheral surface of the active pillar 40 exposed in the filling space 54 is etched to thin the active pillar 40 and increase the volume of the filling space 54. Thinning the active pillar 40 means that the radial distance of the active pillar 40 is reduced, i.e. the diameter of the active pillar 40 is reduced after etching. Taking the plane parallel to the substrate 30 as a cross section, the etched active pillar 40 is in the region of the active pillar 40 before etching.

At S502, the dielectric layer is formed on part close to the substrate of the outer peripheral surface of the active pillar. There is a gap between the dielectric layer and the first support layer.

As shown in FIG. 13 and FIG. 14, the dielectric layer 70 is formed on part exposed in the filling space 54 and close to the substrate 30, of the outer peripheral surface of the active pillar 40. That is, the dielectric layer 70 is formed on the outer peripheral surface of the active pillar 40 located at the lower part of the filling space 54, circumferentially surrounds and covers this part of the active pillar 40. There is no contact between the dielectric layer 70 and the first support layer 60 to provide a space required for forming the conductive layer 80.

In some possible embodiments, the material of the active pillar 40 is silicon, and the material of the dielectric layer 70 is silicon oxide. The dielectric layer 70 is grown on the outer peripheral surface, exposed in the filling space 54, of the active pillar 40 by a thermal oxidation process. The dielectric layer 70 located on part away from the substrate 30, of the active pillar 40 is then removed, to retain the dielectric layer 70 located on part close to the substrate 30, of the active pillar 40.

In other possible embodiments, the dielectric layer 70 is formed on the outer peripheral surface exposed in the filling space 54, of the active pillar 40 by a deposition process. Then, the dielectric layer 70 located on part away from the substrate 30, the active pillar 4 is removed by etching with controlling the parameters in the etching process, to retain the required dielectric layer 70.

At S503, the conductive layer is formed on the outer peripheral surface of the dielectric layer, and fills between the dielectric layer and the first support layer.

Still referring to FIG. 13 and FIG. 14, the conductive layer 80 is formed on the outer peripheral surface of the dielectric layer 70 by depositing, and fills between the dielectric layer 70 and the first support layer 60. That is, the conductive layer 80 fills up the space between the dielectric layer 70 and the first support layer 60. The conductive layer 80 includes a second surrounding portion 81 surrounding the dielectric layer 70 and a second connecting portion 82 connecting adjacent second surrounding portions 81. The second surrounding portion 81 is shown as an area surrounded by dotted lines in FIG. 12. The second surrounding portion 81 and the dielectric layer 70 constitute a gate. The conductive layer 80 and the dielectric layer 70 constitute the word line 20 (referring to FIG. 2), that is, part of the word line 20 serves as the gate.

It should be noted that the conductive layer 80 further includes an extension portion connected to the outer side of the second surrounding portion 81 located at outermost side, in which the outer side refers to one side of the outermost second surrounding portion 81 away from other second surrounding portions 81. Exemplarily, the left side of the second surrounding portion 81 located at the leftmost side is connected with one extension portion and the right side thereof is connected with the second connecting portion 82; the right side of the second surrounding portion 81 located at the rightmost side is connected with one extension portion, and the left side thereof is connected with the second connecting portion 82. By arranging the extension portions, the conductive layer 80 can be connected with a peripheral circuit, thereby realizing the control function of the word line 20.

Specially, the formation of the conductive layer 80 filling between the dielectric layer 70 and the first support layer 60, on the outer peripheral surface of the dielectric layer 70 may include the following operations.

An initial conductive layer is deposited in the enlarged filling space 54. The initial conductive layer fills between the dielectric layer 70 and the first support layer 60 and covers the dielectric layer 70. The initial conductive layer is deposited between the dielectric layer 70 and the first support layer 60, and also covers the dielectric layer 70. For example, the initial conductive layer fills up the enlarged filling space 54.

After the initial conductive layer is formed, the initial conductive layer located on the dielectric layer 70 is removed to expose the dielectric layer 70, while the remaining part of the initial conductive layer forms the conductive layer 80. The surface facing away from the substrate 30, of the conductive layer 80 is flush with the surface facing away from the substrate 30, of the dielectric layer 70. Referring to FIG. 13 and FIG. 14, the initial conductive layer located on the side facing away from the substrate 30 of the dielectric layer 70 is removed by an etching process, and the remaining part of the initial conductive layer forms the conductive layer 80. The upper surface of the conductive layer 80 is flush with the upper surface of the dielectric layer 70. That is, the required conductive layer 80 is formed by depositing and etching back.

To sum up, according to the method for manufacturing a memory in the embodiments of the disclosure, each bit line 10 in the substrate 30 includes the plurality of straight line segments connected end to end in sequence, and the adjacent straight line segments have the included angle therebetween. By forming the plurality of active pillars 40 arranged at intervals on the substrate 30, the density of the active pillars 40 can be improved by arranging the plurality of active pillars 40 in the staggered manner on the substrate 30, thereby improving the performance of the memory. At least two active pillars 40 are electrically connected to each straight line segment of each bit line 10, thereby reducing the bending number of each bit line 10 and facilitating the manufacture of the memory. In addition, the insulating layer 50 covers the outer peripheral surface of the active pillar 40. After removing part of the insulating layer 50, the dielectric layer 70 and the conductive layer 80 are formed between the exposed active pillars 40. The dielectric layer 70 and the conductive layer 80 constitute the gate, and the plurality of active pillars 40 are staggered on the substrate 30, which increases the width of the gate in the radial direction of the active pillar 40, improves the forming quality of the gate, reduces the resistance of the gate and further improves the performance of the memory.

In some possible embodiments, referring to FIG. 15 to FIG. 22, the operation (S200) that the plurality of active pillars arranged at intervals and the plurality of insulating layers arranged at intervals are formed on the substrate, in which each straight line segment of each bit line is electrically connected with at least two active pillars, and the insulating layers extend along the first direction and cover the outer peripheral surfaces of the active pillars, may include the following operations.

At S201, a plurality of active lines arranged at intervals are formed on the substrate. Each active line corresponds to and is electrically connected one bit line.

Figure 15:
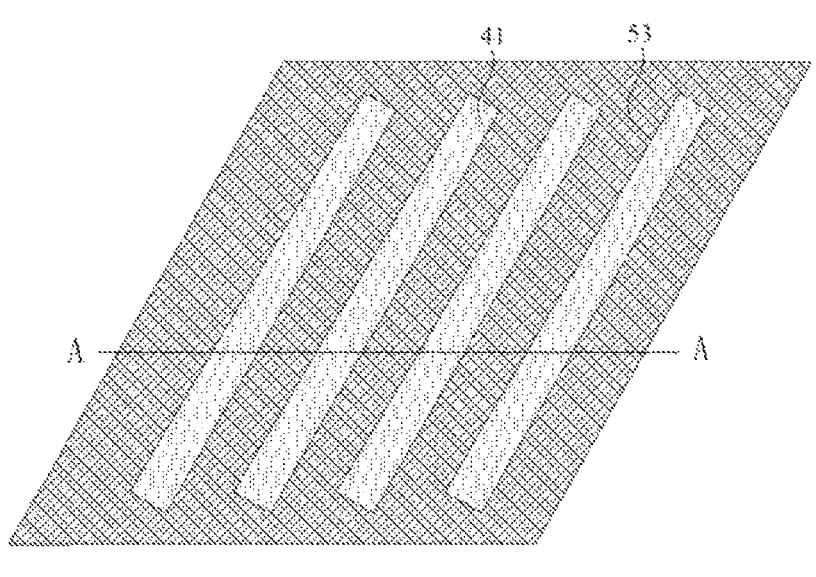
FIG. 15 is a top view after active lines are formed in an embodiment of the disclosure.
Figure 16:
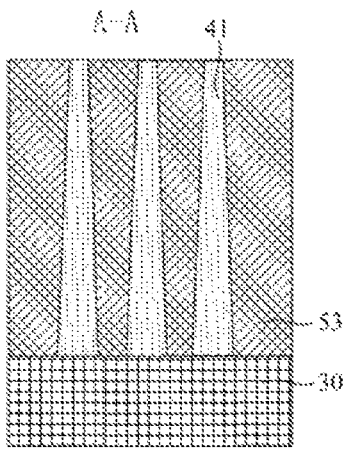
FIG. 16 is a schematic structural diagram at A-A in FIG. 15.

Specifically, referring to FIG. 2, FIG. 15 and FIG. 16, the plurality of active lines 41 arranged at intervals are formed by an etching process, in which the plurality of active lines 41 are parallel to each other. Each active line 41 corresponds to one bit line 10 and is electrically connected to the corresponding bit line 10 to achieve the electrical connection between the active line 41 and the bit line 10.

Exemplarily, each active line 41 includes a plurality of first active segments extending in the second direction, and a plurality of second active segments extending in the third direction. One second active segment is connected with two adjacent first active segments. The first active segment corresponds to and is in contact with the first straight line segment of the bit line 10, and the second active segment corresponds to and is in contact with the second straight line segment of the bit line 10.

At S202, an initial insulating layer is formed on the substrate, and fills between adjacent active lines.

Still referring to FIG. 15 and FIG. 16, an initial insulating layer 53 is deposited on the substrate 30, and fills between the active lines 41 to isolate the active lines 41 from each other. Specifically, the initial insulating layer 53 is deposited to fill between and cover the active lines 41. Then, the initial insulating layer 53 located on the active lines 41 is removed by etching to expose the active lines 41.

At S203, part of the initial insulating layer and part of each active line are removed to form a plurality of first grooves arranged at intervals. The first grooves divide each active line into multiple active pillars. The remaining part of the initial insulating layer forms part of the first surrounding portion, and the first connecting portion connecting the first surrounding portion.

Referring to FIG. 17 to FIG. 22, the initial insulating layer 53 and the active lines 41 are etched to form the plurality of first grooves 42 arranged at intervals. The first grooves 42 extend in the first direction, and divide each active line 41 into multiple active pillars 40.

Figure 17:
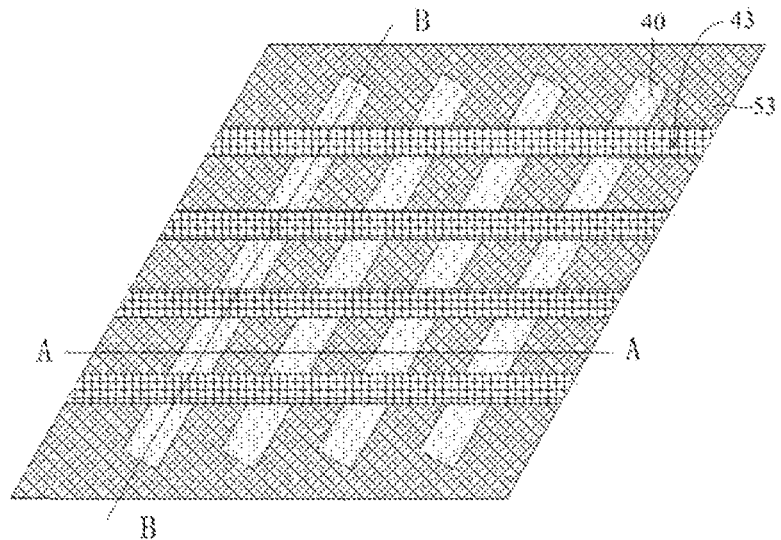
FIG. 17 is a top view after initial grooves are formed in an embodiment of the disclosure.
Figure 18:
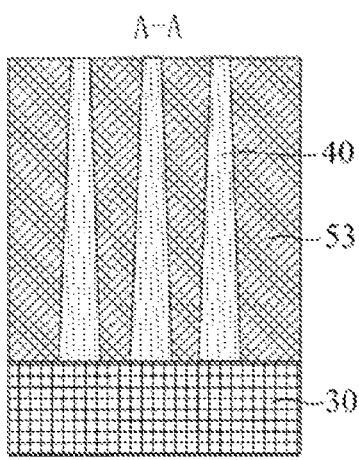
FIG. 18 is a schematic structural diagram at A-A in FIG. 17.
Figure 19:
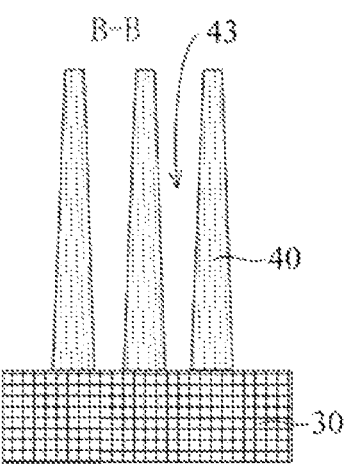
FIG. 19 is a schematic structural diagram at B-B in FIG. 17.

Specifically, part of the initial insulating layer 53 and part of the active line 41 are removed to form a plurality of initial grooves 43 arranged at intervals and extending in the first direction. As shown in FIG. 17 to FIG. 19, the initial groove 43 exposes the substrate 30, and has a substantially constant width equal in the first direction.

Figure 20:
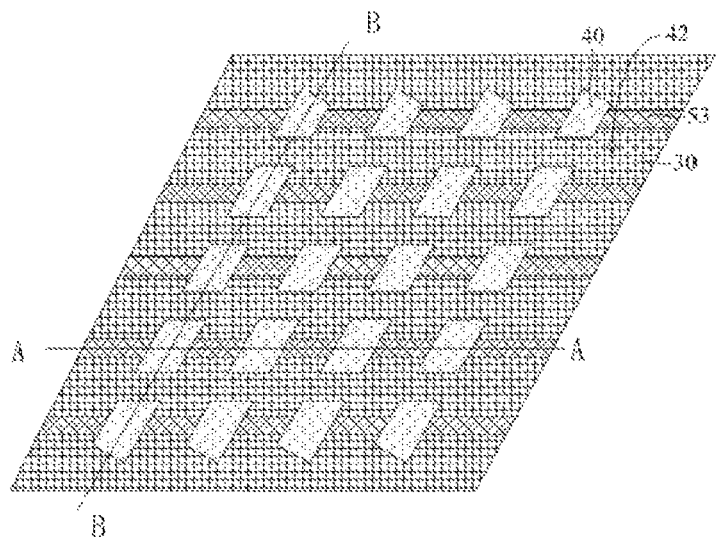
FIG. 20 is a top view after first grooves are formed in an embodiment of the disclosure.
Figure 21:
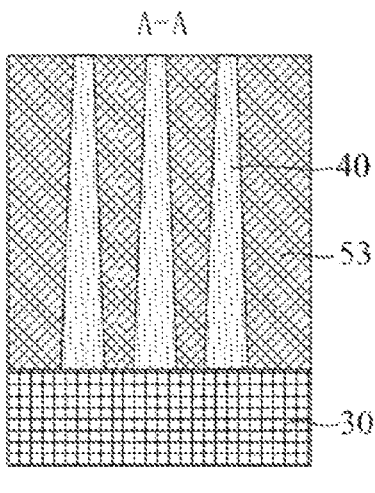
FIG. 21 is a schematic structural diagram at A-A in FIG. 20.
Figure 22:
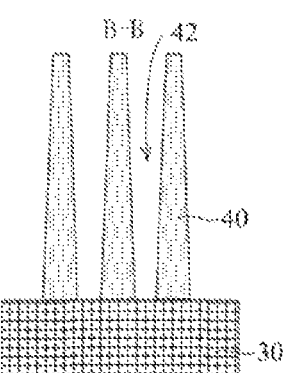
FIG. 22 is a schematic structural diagram at B-B in FIG. 20.

After the initial grooves 43 are formed, part exposed in the initial grooves 43 of the initial insulating layer 53 is removed to thin the initial insulating layer 53 located between adjacent initial grooves 43 to form the first grooves 42. As shown in FIG. 20 to FIG. 22, the initial insulating layer 53 exposed in the initial groove 43 is etched to thin the initial insulating layer 53. The thinned initial insulating layer 53 forms the first connecting portion 52 (referring to FIG. 3) and part of the first surrounding portion 51. The surface area exposed in the initial grooves 43, of the active pillar 40 is increased, and the enlarged initial grooves 43 serve as the first grooves 42.

In some possible embodiments, as shown in FIG. 20, taking the plane parallel to the substrate as a cross section, the cross section of the active pillar 40 is in a quadrilateral-like shape. For example, the cross section of the active pillar 40 is in a shape of a parallelogram or a rhombus. After the operation that the part exposed in the initial grooves 43, of the initial insulating layer 53 is removed to thin the initial insulating layer 53 located between adjacent initial grooves 43 to form the first grooves 42, the method further include an operation of removing part exposed in the first groove 42 of the active pillar 40 to fillet-transition the outer peripheral surface of the active pillar 40.

Figure 23:
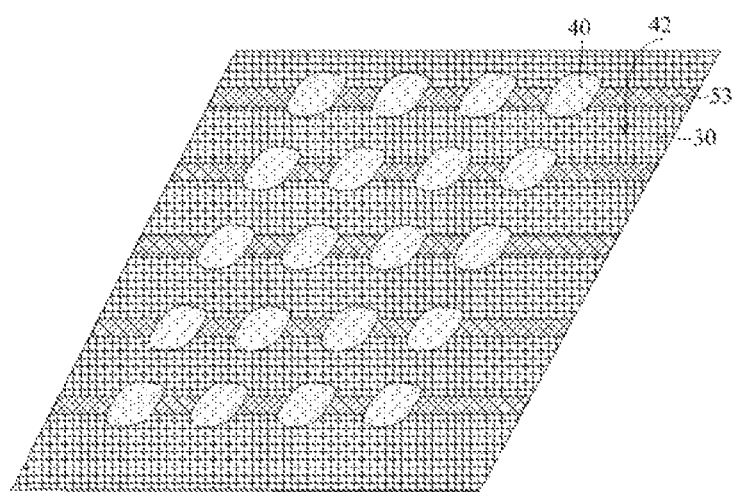
FIG. 23 is a top view of after active pillar are rounded in an embodiment of the disclosure.

Specifically, the active pillar 40 exposed in the first groove 42 is etched by a wet etching with an alkaline solution, so that the outer peripheral surface of each active pillar 40 is fillet-transitioned. As shown in FIG. 23, the active pillar 40 is an approximate cylinder or an elliptic cylinder. The alkaline solution may be a potassium hydroxide solution or a SC1 solution. This solution has a faster reaction rate at sharp corners, which can make the corners of the active pillar 40 with the quadrilateral cross-sectional shape rounded, and make the dielectric layer 70 and the conductive layer 80 formed subsequently more uniform, improving the quality of the structure formed subsequently.

At S204, part of the first surrounding portion is formed on the outer peripheral surface exposed in the first groove, of the active pillar.

Specifically, part of the first surrounding portion 51 is formed on the outer peripheral surface of the active pillar 40 by a thermal oxidation process. The first surrounding portion 51 covering the outer peripheral surface of the active pillar 40 is formed by this operation and the previous operation.

In some possible embodiments, the method further includes an operation of forming a second support layer covering the conductive layer in the remaining part of the filling space, after the dielectric layer and the conductive layer are formed between the active pillars exposed in the filling space and close to the substrate to form the word line (S500).

Figure 25:
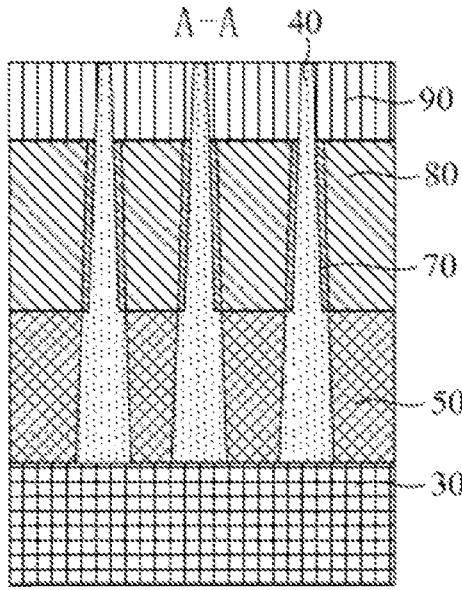
FIG. 25 is a schematic structural diagram at A-A in FIG. 24.

Referring to FIG. 24 to FIG. 26, the second support layer 90 is deposited on the conductive layer 80 and the dielectric layer 70 to insulate and isolate the conductive layer 80. The second support layer 90 fills up the remaining part of the filling space 54, and the surface away from the substrate 30, of the active pillar 40 is exposed.

The material of the second support layer 90 may be the same as the material of the first support layer 60, so that the second support layer 90 is integrated with the first support layer 60, reducing or avoiding delamination or separation between the second support layer 90 and the first support layer 60. The surface facing away from the substrate 30, of the second support layer 90 may be flush with the surface facing away from the substrate 30, of the first support layer 60. By this arrangement, the first support layer 60 and the second support layer 90 form a flat surface, which is convenient for manufacturing other structures thereon.

In some possible embodiments, the method further includes an operation of, on each active pillar, forming a capacitor electrically connected to this active pillar, the capacitor being aligned with this corresponding active pillar, after the dielectric layer and the conductive layer are formed between the active pillars exposed in the filling space and close to the substrate to form the word line (S500).

Exemplarily, the bottom surface of the capacitor is in contact with and aligned with the top surface of the active pillar 40, which realizes the electric connection between the capacitor and the active pillar 40 on the one hand, and ensures the contact area between the capacitor and the active pillar 40 on the other hand, thereby reducing the contact resistance between the capacitor and the active pillar 40.

Embodiments of the disclosure also provide a memory. Referring to FIG. 2, and FIG. 24 to FIG. 26, the memory includes a substrate 30, an active pillar 40, an insulating layer 50, a dielectric layer 70, a conductive layer 80, and a support layer. The substrate 30 is used for providing support, and may be a semiconductor substrate. The material of the semiconductor substrate may be one or more of silicon, germanium, silicon germanium, silicon carbide, Silicon on Insulator (SOI), Germanium on Insulator (GOI), or the like.

A plurality of bit lines 10 arranged at intervals are formed in the substrate 30 (referring to FIG. 2). Each bit line 10 includes a plurality of straight line segments connected end to end in sequence, and adjacent line segments have an included angle therebetween, so that each bit line 10 is in a type of a zigzag line. Specifically, the plurality of straight line segments included by each bit line 10 include a plurality of first straight line segments 11 extending in a second direction and a plurality of second straight line segments 12 extending in a third direction. One second straight line segment 12 connects two first straight line segments 11 adjacent to this one second straight line segment, so that each bit line 10 is in form of a wavy polyline to make full use of the space of the substrate. Exemplarily, the included angle formed by the first direction and the second direction may be 30° to 150°, for example 120°.

The plurality of active pillars 40 are formed on the substrate 30 and arranged at intervals. Each straight line segment of each bit line 10 is electrically connected with at least two active pillars 40. For example, the active pillar 40 is in contact with the bit line 10 to achieve the electrical connection between the active pillar 40 and the bit line 10. By electrically connecting multiple active pillars 40 with each straight line segment, it is avoided that each bit line 10 needs to be bent once every time it passes through one active pillar 40, thereby reducing the bending number of each bit line 10 and reducing the manufacturing difficulty of the bit line 10.

In some possible embodiments, the bit line 10 covers the orthographic projections of multiple active pillars 40 on the substrate 30. By this arrangement, the entire bottom surface of the active pillar 40 is in contact with the bit line 10, and the contact area between the active pillar 40 and the bit line 10 is large, thereby reducing the contact resistance between the active pillar 40 and the bit line 10.

In other possible embodiments, taking the plane parallel to the substrate 30 as a cross section, multiple of active pillars 40 are arranged in a hexagonal close-packed structure. As shown in FIG. 24, each seven active pillars 40 is regarded as a group, in which the centers of six active pillars 40 enclose into a virtual hexagon, i.e. the centers of the six active pillars 40 are respectively located at the six vertices of the virtual hexagon, and the center of the seventh active pillar 40 is located at the center of the virtual hexagon.

By this arrangement, the density of the active pillars 40 can be increased. When capacitors on the active pillars 40 are also arranged in the hexagonal close-packed structure, on the one hand, the density of the capacitors can be increased, thereby increasing the density of memories; on the other hand, the capacitor can be directly on the active pillar 40 without arranging a capacitor contact pad to transition the formation between the capacitor and the active pillar 40, thereby reducing the complexity of manufacturing the memory. For example, when the active pillars 40 are arranged in a square structure, it is necessary to manufacture capacitor contact pads on the active pillars 40, so as to arrange the capacitors in a hexagonal close-packed structure.

A plurality of insulating layers 50 are also formed on the substrate 30, arranged at intervals and extend in the first direction. Each insulating layer 50 covers the outer peripheral surface of the lower region of the active pillar 40 in its extension direction. The lower region of the active pillar 40 refers to a region of the active pillar 40 close to the substrate 30.

The dielectric layer 70 is formed on the outer peripheral surface of the middle region of the active pillar 40. That is, the dielectric layer 70 covers the outer peripheral surface of the middle region of the active pillar 40. A plurality of conductive layers 80 arranged at intervals are provided on the insulating layer 50. A conductive layer 80 extends in the first direction and covers the outer peripheral surface of the dielectric layer 70. The conductive layer 80 and the dielectric layer 70 form a word line.

In some possible embodiments, as shown in FIG. 2, the included angle between the second direction and the first direction is 60°, the included angle between the third direction and the first direction is 60°, and a first pitch between adjacent word lines 20 is equal to a second pitch between adjacent bit lines 10. By this arrangement, it is convenient to form the plurality of active pillars arranged in the hexagonal close-packed structure, reducing the difficulty of manufacturing the active pillars arranged in the hexagonal close-packed structure.

The support layer fills between the insulating layers 50, between the conductive layers 80, and between upper regions of the active pillars 40. The support layer isolates each insulating layer 50, each conductive layer 80, and each active pillar 40. Specifically, the support layer includes a first support layer 60 and a second support layer 90. The first support layer 60 fills between the insulating layers 50, between the conductive layers 80, and extends between the upper regions of the active pillars 40. The second support layer 90 fills between the first support layer 60 and the upper region of the active pillar 40.

In the memory of the embodiments of the disclosure, each bit line 10 in the substrate 30 includes the plurality of straight line segments connected end to end in sequence, and adjacent straight line segments have the included angle therebetween. By forming the plurality of active pillars 40 that are arranged at intervals on the substrate 30 and staggered on the substrate 30, the density of the active pillars 40 can be improved, which improves the performance of the memory. Each straight line segment of each bit line 10 is electrically connected with at least two active pillars 40, which reduces the bending number of each bit line 10 and facilitates the manufacture of the memory. In addition, the dielectric layer 70 and part of the conductive layer 80 form the gate covering the outer peripheral surface of the active pillar 40, and the plurality of active pillars 40 are staggered on the substrate 10, which increases the width of the gate in the radial direction of the active pillar 40, thereby improving the forming quality of the gate, reducing the resistance of the gate and further improving the performance of the memory.

In this specification, embodiments or implementation modes are described in a progressive manner. Each embodiment focuses on the differences from other embodiments, and the same and similar parts between the embodiments may be referred to each other.

In the description of this specification, the description referring to the terms "one embodiment", "some embodiments", "exemplary embodiment", "example", "specific example" or "some examples" means that the specific features, structures, materials or characteristics described in combination with the embodiments or examples are included in at least one embodiment or example of this disclosure. In the specification, the illustrative description of the above terms does not necessarily refer to the same embodiment or example. Furthermore, the specific features, structures, materials or characteristics described may be combined in any one or more embodiments or examples in a proper manner.

Finally, it should be noted that the above embodiments are only used to illustrate the technical solution of the disclosure, but are not limitative of the disclosure. Although the disclosure has been described in detail with reference to the foregoing embodiments, ordinary persons skilled in the art should understand that the technical solutions described in the foregoing embodiments can be modified, or some or all of the technical features therein can be replaced by equivalents. These modifications or replacements do not make the essence of corresponding technical solutions depart from the scope of the technical solutions of the embodiments of this disclosure.

What is claimed is:

1. A method for manufacturing a memory, comprising:
   providing a substrate, wherein a plurality of bit lines arranged at intervals are formed in the substrate, each bit line comprises a plurality of straight line segments connected end to end in sequence, and adjacent straight line segments have an included angle therebetween;
   forming a plurality of active pillars arranged at intervals and a plurality of insulating layers arranged at intervals on the substrate, wherein each straight line segment of each bit line is electrically connected with at least two active pillars, and each insulating layer extends in a first direction and covers an outer peripheral surface of the active pillar;

filling a first support layer between adjacent insulating layers;

removing part away from the substrate, of the insulating layer to form a filling space, wherein the filling space exposes part of the outer peripheral surface of the active pillar; and forming a dielectric layer and a conductive layer between parts exposed in the filling space and close to the substrate, of the active pillars to form a word line;

wherein forming the dielectric layer and the conductive layer between parts exposed in the filling space and close to the substrate, of the active pillars to form the word line comprises:

at least removing part exposed in the filling space and close to the substrate, of the outer peripheral surface of the active pillar to thin the active pillar and enlarge the filling space;

forming the dielectric layer on part close to the substrate, of the outer peripheral surface of the active pillar, wherein there is a gap between the dielectric layer and the first support layer; and forming the conductive layer on an outer peripheral surface of the dielectric layer, wherein the conductive layer fills between the dielectric layer and the first support layer.

2. The method according to claim 1, wherein the plurality of straight line segments comprised by the each bit line comprise a plurality of first straight line segments extending in a second direction and a plurality of second straight line segments extending in a third direction, wherein one second straight line segment connects two adjacent first straight line segments.

3. The method according to claim 2, wherein an included angle between the second direction and the first direction is 60°, and an included angle between the third direction and the first direction is 60°; and a first pitch between adjacent word lines is equal to a second pitch between adjacent bit lines.

4. The method according to claim 1, wherein taking a plane parallel to the substrate as a cross section, the plurality of active pillars are arranged in a hexagonal close-packed structure.

5. The method according to claim 1, wherein each insulating layer comprises a first surrounding portion covering the outer peripheral surface of the active pillar; and a first connecting portion connecting two adjacent first surrounding portions and extending in the first direction.

6. The method according to claim 5, wherein forming the plurality of active pillars arranged at intervals and the plurality of insulating layers arranged at intervals on the substrate, wherein each straight line segment of each bit line is electrically connected with at least two active pillars, and the insulating layer extends in the first direction and covers the outer peripheral surface of the active pillar, comprises:

forming a plurality of active lines arranged at intervals on the substrate, wherein each active line corresponds to and is electrically connected to one bit line;

forming an initial insulating layer on the substrate, wherein the initial insulating layer fills between adjacent active lines;

removing part of the initial insulating layer and part of each active line to form a plurality of first grooves arranged at intervals, wherein the plurality of first grooves divide the active line into a plurality of active pillars; and forming part of the first surrounding portion on part exposed in the first grooves of the outer peripheral surface of the active pillar.

7. The method according to claim 6, wherein removing part of the initial insulating layer and part of each active line to form the plurality of first grooves arranged at intervals, wherein the plurality of first grooves divide the active line into the plurality of active pillars, comprises:

removing part of the initial insulating layer and part of each active line to form a plurality of initial grooves arranged at intervals and extending in the first direction; and removing part exposed in the initial grooves, of the initial insulating layer to thin the initial insulating layer located between adjacent initial grooves to form the first grooves.

8. The method according to claim 7, wherein taking a plane parallel to the substrate as a cross section, the active pillar has a cross section in a shape of a quadrilateral, and the method further comprises:

removing part exposed in the first grooves, of the active pillar, to make the outer peripheral surface of the active pillar fillet-transition, after removing part exposed in the initial grooves, of the initial insulating layer to thin the initial insulating layer located between adjacent initial grooves to form the first grooves.

9. The method according to claim 8, wherein the part exposed in the first grooves, of the active pillar is etched by a wet etching with an alkaline solution.

10. The method according to claim 6, wherein the part of the first surrounding portion is formed on the outer peripheral surface of the active pillar by a thermal oxidation process.

11. The method according to claim 1, wherein forming the conductive layer on the outer peripheral surface of the dielectric layer, wherein the conductive layer fills between the dielectric layer and the first support layer, comprises:

depositing an initial conductive layer in the enlarged filling space, wherein the initial conductive layer fills between the dielectric layer and the first support layer, and covers the dielectric layer;

removing the initial conductive layer located on the dielectric layer to expose the dielectric layer, wherein a remaining part of the initial conductive layer forms the conductive layer, and a surface facing away from the substrate, of the conductive layer is flush with a surface facing away from the substrate, of the dielectric layer.

12. The method according to claim 1, wherein the method further comprises:

forming a second support layer in a remaining part of the filling space, wherein the second support layer covers the conductive layer, after forming the dielectric layer and the conductive layer between parts exposed in the filling space and close to the substrate, of the active pillars to form the word line.

13. The method according to claim 1, wherein the method further comprises:

on each active pillar, forming one capacitor electrically connected to the each active pillar, wherein the one capacitor is aligned with the corresponding active pillar, after forming the dielectric layer and the conductive layer between parts exposed in the filling space and close to the substrate, of the active pillars to form the word line.

* * * * *